United States Patent
Baioumy et al.

(10) Patent No.: US 11,238,512 B1
(45) Date of Patent: Feb. 1, 2022

(54) COMPUTER-READABLE MEDIA, METHOD, AND SYSTEM FOR PRODUCING PHYSICAL ARTIFACTS

(71) Applicant: Amazon Technologies, Inc., Seattle, WA (US)

(72) Inventors: Mohamed-Usama H. Baioumy, Snoqualmie, WA (US); Venkata Sirisha Reddy Ginni, Redmond, WA (US)

(73) Assignee: Amazon Technologies, Inc., Seattle, WA (US)

( * ) Notice: Subject to any disclaimer, the term of this patent is extended or adjusted under 35 U.S.C. 154(b) by 11 days.

(21) Appl. No.: 16/700,880

(22) Filed: Dec. 2, 2019

(51) Int. Cl.
| | |
|---|---|
| G06Q 30/06 | (2012.01) |
| G06F 30/12 | (2020.01) |
| G06Q 50/04 | (2012.01) |
| G06F 3/0482 | (2013.01) |
| G06K 19/06 | (2006.01) |

(52) U.S. Cl.
CPC ......... *G06Q 30/0621* (2013.01); *G06F 30/12* (2020.01); *G06Q 30/0643* (2013.01); *G06Q 50/04* (2013.01); *G06F 3/0482* (2013.01); *G06K 19/06037* (2013.01)

(58) Field of Classification Search
CPC ........................................ G06Q 30/0601–0645
See application file for complete search history.

(56) References Cited

U.S. PATENT DOCUMENTS

| | | | | |
|---|---|---|---|---|
| 10,021,173 | B2 * | 7/2018 | Sugaya | H04L 67/1012 |
| 2005/0144091 | A1 * | 6/2005 | Harper | G06Q 30/0641 |
| | | | | 705/27.1 |
| 2006/0015402 | A1 * | 1/2006 | Graves | G06Q 30/0207 |
| | | | | 705/14.1 |
| 2012/0150655 | A1 * | 6/2012 | Seth | G06Q 30/02 |
| | | | | 705/14.66 |
| 2014/0195921 | A1 * | 7/2014 | Grosz | G06Q 30/0601 |
| | | | | 715/738 |
| 2014/0310380 | A1 * | 10/2014 | Newman | H04L 67/06 |
| | | | | 709/217 |

(Continued)

OTHER PUBLICATIONS

Gallaga, O. L. (Dec. 5, 2011). How do you wrap an ebook or MP3 album? The Courier Retrieved from https://dialog.proquest.com/professional/docview/908583983?accountid=131444.*

(Continued)

*Primary Examiner* — Resha Desai
(74) *Attorney, Agent, or Firm* — Kilpatrick Townsend & Stockton LLP

(57) ABSTRACT

A system manages the customization of content for three-dimensional physical artifacts. The three-dimensional physical artifacts represent digital content items such as electronic books. The systems receives as input requests for physical artifacts and customization instructions. The customization instructions may define an arrangement of content on a back side of the digital content item. The content may include barcode(s) relating to the electronic content item (e.g., a link to a location where the electronic content item may be obtained). The system uses the input to generate sets of machine-readable instructions that are used by a production apparatus to produce the content of the physical artifacts.

20 Claims, 8 Drawing Sheets

(56) References Cited

U.S. PATENT DOCUMENTS

| | | | |
|---|---|---|---|
| 2015/0197117 A1* | 7/2015 | Begin .................. | B42D 15/022 40/124.03 |
| 2017/0090702 A1* | 3/2017 | Hamilton ........... | G06Q 30/0621 |
| 2017/0200193 A1* | 7/2017 | Bigley ............... | G06Q 30/0621 |
| 2018/0247359 A1* | 8/2018 | Kressler .............. | G06Q 20/342 |

OTHER PUBLICATIONS

McCollum, M. (Aug. 18, 2019). Dowdy, U.B.E. to offer textbook deals. University Wire Retrieved from https://dialog.proquest.com/professional/docview/2274859753?accountid=131444.*

* cited by examiner

COMPUTER-READABLE MEDIA, METHOD, AND SYSTEM FOR PRODUCING PHYSICAL ARTIFACTS

BACKGROUND

Works of authorship such as books are generally available in many different formats. For example, for a typical book, there may be a physical hard copy version, a physical paperback version, an audio version, and an electronic text version. The physical formats may be displayed, stored, or otherwise exist in the physical world (e.g., on a bookshelf in a library). The electronic versions exist in digital formats and stored in digital libraries. At times, owners of an electronic and/or virtual version of a work may desire one or more of the features and/or benefits of a physical version of the work without having to take on full ownership of the physical version.

BRIEF DESCRIPTION OF THE DRAWINGS

Various examples in accordance with the present disclosure will be described with reference to the drawings, in which.

DETAILED DESCRIPTION

Figure 1:
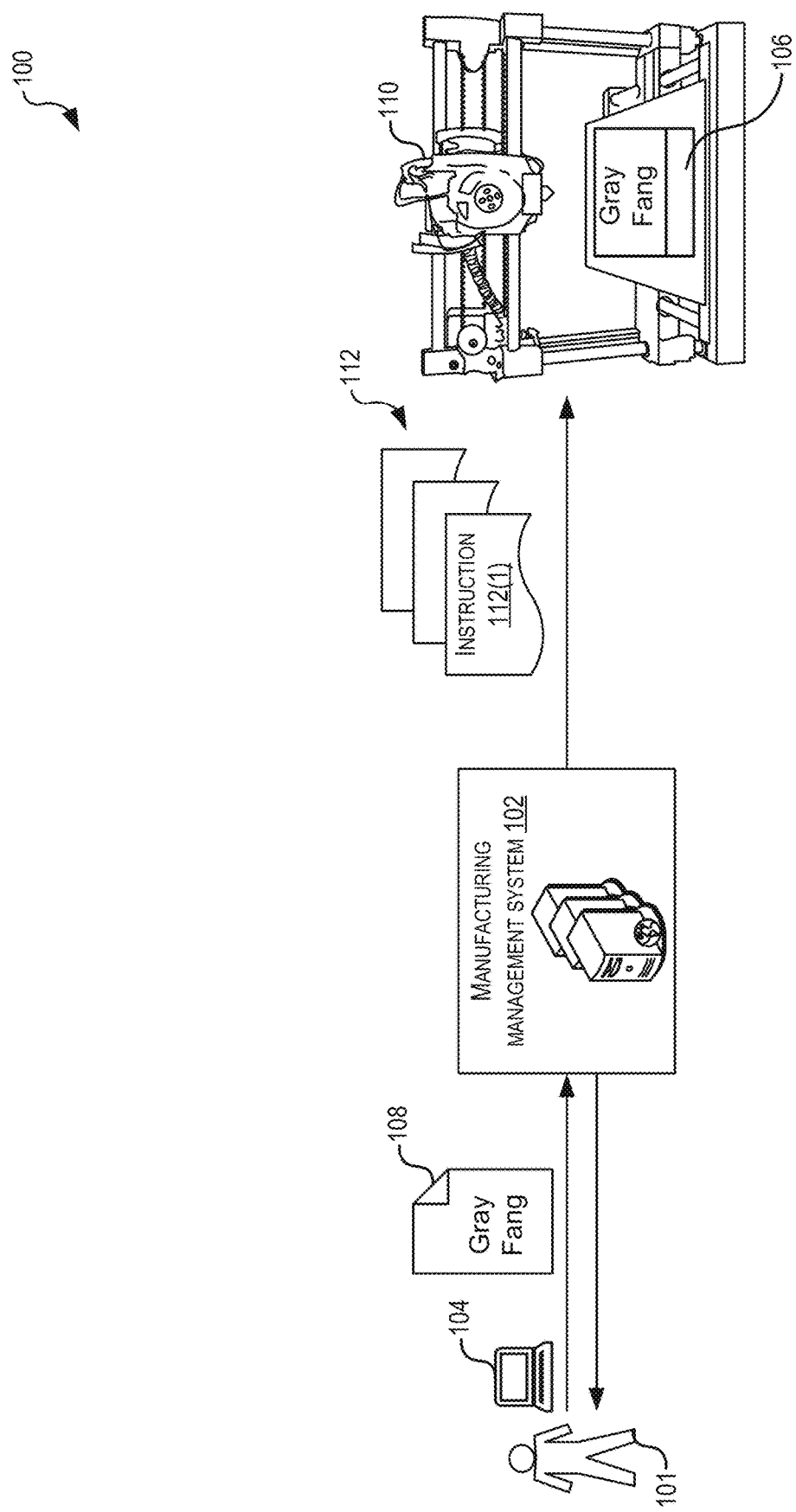
FIG. 1 is a schematic diagram illustrating an example system for generating instructions for producing physical artifacts corresponding to digital content items, according to at least one example.

In the following description, various examples will be described. For purposes of explanation, specific configurations and details are set forth in order to provide a thorough understanding of the examples. However, it will also be apparent to one skilled in the art that the examples may be practiced without the specific details. Furthermore, well-known features may be omitted or simplified in order not to obscure the example being described.

Examples described herein are generally directed to systems, devices, and techniques for producing physical artifacts (e.g., physical representations) of digital content items. The physical artifacts may be produced on-demand (e.g., responsive to a user request) and may be customized based on user preferences. Options for requesting physical artifacts may be presented to users when a trigger is detected. For example, a system may detect when a user finishes an electronic version of a book (e.g., an eBook), and prompt the user to request production of a three-dimensional plaque of the book (e.g., a type of a physical artifact). The three-dimensional plaque may be designed to look like a print version of the book (e.g., have a rectangular three-dimensional shape and include a front cover and a spine that mimic the physical book), with a few differences. For example, the plaque may be solid (e.g., will not include any pages between the front cover and a back cover), and the back cover may include an arrangement of customized content (e.g., a user-specific barcode, a link to an author page, a link to a detail page for the book, etc.), which is different from the print version. Users may display their plaques (e.g., in a home library) to serve as a reminder of eBooks they have read. The customized content on the back cover can be used to access additional information about the book, read an excerpt, follow the author, or view a series to which the book belongs, and can also be used to share the book with others (e.g., by scanning a barcode).

Turning now to a particular example, an option to obtain a physical plaque version of a book (e.g., electronic version or otherwise) may be presented at a user device alongside options to obtain other versions of the book (e.g., a hard copy version, an electronic version, a paperback version, an audio version, etc.). The physical plaque may have a similar appearance to a hard copy version (or paperback version) of the book. Once the option for obtaining the physical plaque has been selected, a set of customization options is presented at the user device. The customization options allow user customization of certain aspects of the physical plaque, such as barcodes that link to different webpages/content, dimensions of the plaque, arrangement of sections on a back cover of the physical plaque, and content to be included in each section of the back cover. After information about the customization options has been received, a set of instructions is generated for producing content for the physical plaque. For example, the set of instructions may include instructions for printing the customized content on to a pre-manufactured block of material (e.g., a plastic plaque) or as a paper cover that can be attached to the pre-manufactured block. The set of instructions may also include manufacturing instructions that can be executed by a three-dimensional printer to produce the physical plaque. This set of instructions may then be passed to the three-dimensional printer to produce the physical plaque. After which, the physical plaque may be delivered to or otherwise made available for pickup by a user.

Turning now to the figures, FIG. 1 illustrates an example system 100 for implementing techniques relating to generating instructions for producing physical artifacts corresponding to digital content items, as described herein. To this end, the system 100 includes a manufacturing management system 102. The manufacturing management system 102, as described in detail with respect to FIG. 7, communicates with a user device 104 and a production apparatus 110. Using any suitable software, application, etc. running on the user device 104 or otherwise, a user 101 may provide input to the manufacturing management system 102 to design a physical artifact 106 (e.g., a three-dimensional item). Content of the physical artifact 106 and/or the physical artifact itself may be produced by the production apparatus 110.

In order to produce the physical artifact 106, a three-dimensional printer, such as the production apparatus 110, may be used. The user 101 may use the user device 104 to provide characteristic information 108 that represents the physical artifact 106 to the manufacturing management system 102. The characteristic information 108 may be generated at the user device 104 or at the manufacturing management system 102 based on inputs received at the user device 104. For example, the manufacturing management system 102 and/or different system may provide a detail webpage of a digital content item (e.g., a book, movie, TV series, song, album, etc.) to the user device 104, and the user 101 use the user device 104 to provide inputs at the detail webpage that cause the manufacturing management system 102 to generate a set of manufacturing instructions 112 for later use by the production apparatus 110. In some examples, the manufacturing management system 102 may include one or more server computers configured to perform the techniques described herein. In some examples, the production apparatus 110 may include one or more computing devices configured to process the characteristic information 108 and generate the set of manufacturing instructions 112. In some examples, the manufacturing management system 102 manages the operation of the production apparatus 110. In some examples, the manufacturing management system 102 may be associated with an electronic marketplace. For example, the manufacturing management system 102 may be operated by a manufacturing entity that manufactures three-dimensional items for customers of the electronic marketplace. In this example, the customers (e.g., the user 101) may provide the characteristic information 108 to the electronic marketplace and the electronic marketplace may facilitate delivery of the characteristic information to the manufacturing management system 102. In some examples, electronic marketplace may generate the set of manufacturing instructions 112. The manufacturing entity may then manage fulfillment of the completed (printed) three-dimensional items to the user 101 or other users. In some examples, the manufacturing management system 102 is operated by the same entity that manages the electronic marketplace.

The production apparatus 110 may include any suitable additive and/or subtractive manufacturing apparatus configured to perform any suitable manufacturing process. For example, the production apparatus 110 is illustrated as an extrusion deposition type of apparatus. Other suitable manufacturing apparatuses may be configured to perform processes including, for example, a screen printing machine, a digital ink jet printing machine, a flexo printing machine, a ultra violet (UV) lithography printing machine, laser printing machine, a pad printing machine, an electron beam freeform fabrication machine, a direct metal laser sintering machine, an electron-beam melting machine, a selective heat sintering machine, a selective laser sintering machine, s plaster-based three-dimensional printing machine, a laminated object manufacturing machine, a stereolithography machine, a digital light processing machine, and/or any other suitable additive and/or subtractive production machine.

The set of manufacturing instructions 112 may, when executed by a processor associated with production apparatus 110 (e.g., a processor within the production apparatus 110 or within a computer configured to control the production apparatus 110), instruct components of the production apparatus 110 (e.g., an extrusion head, a table, a feed controller, etc.) to perform various operations to produce the physical artifact 106. In some examples, the manufacturing management system 102 may include functionality similar to a "slicer" (e.g., a piece of software that converts a three-dimensional model into a series of thin layers and produces a numerical control file (e.g., "G" codes and "M" codes)). Thus, in some examples, the set of manufacturing instructions 112 is an example of a numerical control file. In some examples, the functionality of the manufacturing management system 102 and the software that controls the production apparatus 110 may be included in the same system or as part of the same service.

The set of manufacturing instructions 112 may also include at least one customization manufacturing instruction 112(1). The customization manufacturing instruction 112(1) may, when executed by the processor associated with the production apparatus 110, instruct the components of the production apparatus 110 to produce customized aspects of the physical artifact 106. For example, the customization manufacturing instructions 112(1) may be used to modify an existing model of the physical artifact that is represented by the other three-dimensional manufacturing instructions 112. In some examples, the customized content is produced without use of the customization manufacturing instruction 112(1).

In some examples, the customized aspects may be added to the physical artifact 106 as determined by the manufacturing management system 102 and/or in accordance with instructions from the user 101 (e.g., the characteristic information 108). For example, the customized aspects may include a two-dimensional barcode, printed, embossed, or engraved on a portion of the physical artifact 106. The two-dimensional barcode may cause some action to occur when scanned (e.g., share information about the physical artifact 106, link to webpage, etc.).

Figure 2:
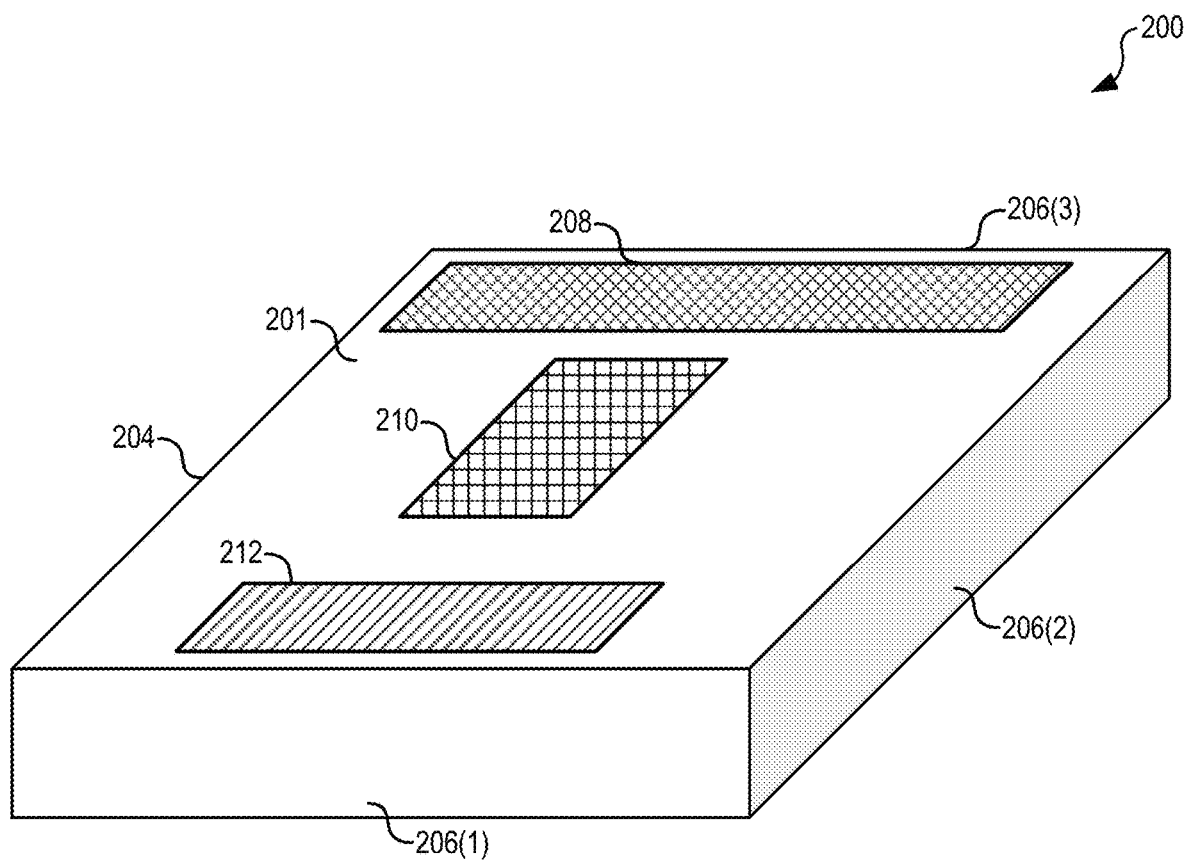
FIG. 2 illustrates an example perspective view of a physical artifact produced using various techniques relating to generating instructions for producing physical artifacts corresponding to digital content items, according to at least one example.
Figure 3:
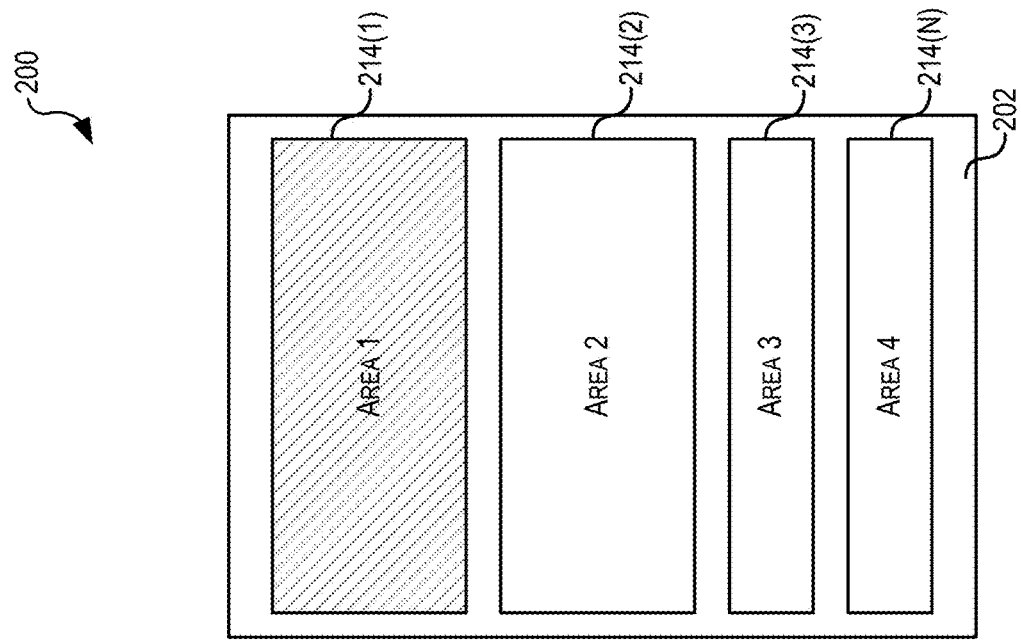
FIG. 3 illustrates various views of a physical artifact produced using various techniques relating to generating instructions for producing physical artifacts corresponding to digital content items, according to at least one example.
Figure 3:
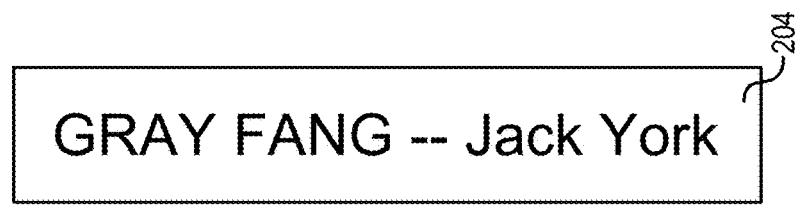
Figure 3:
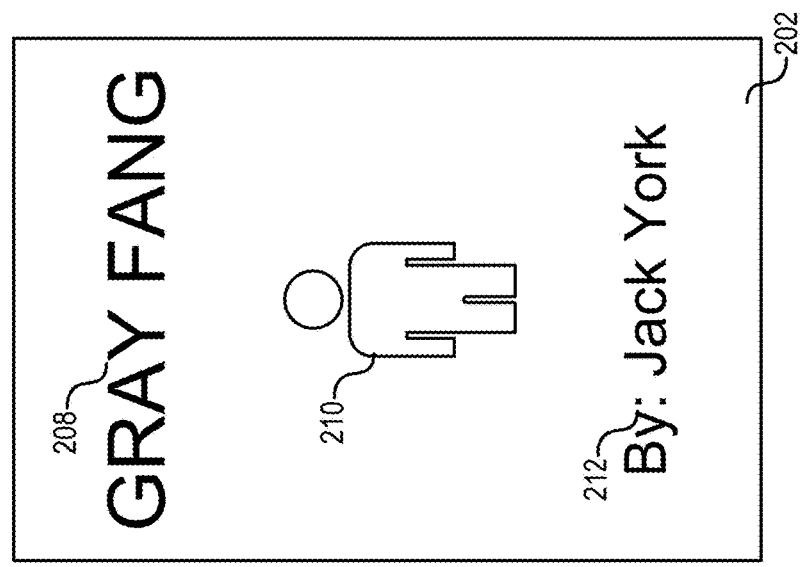

FIGS. 2 and 3, respectively, illustrate an example perspective view and various other views of a physical artifact 200 produced using various techniques relating to generating instructions for producing physical artifacts corresponding to digital content items, according to various examples. The physical artifact 200 is an example of the physical artifact 200 described with reference to FIG. 1. While the physical artifact 200 described takes the shape and form of a rectangular physical book, the techniques described herein are applicable to producing physical artifacts having other shapes and representing other types of digital content items. Thus, the physical artifact 200 formed as a representation of a physical book is just one example.

The physical artifact 200 may include six sides (e.g., a front side 201, a back side 202 opposite the front side 201, a spine 204, and other sides 206(1)-206(3)). The front side 201, which may be referred to as a front cover, includes predefined content such as a title 208, cover art 210, and an author 212. The title 208, the cover art 210, and the author 212 may be considered predefined content because this content may be unmodifiable by a user (e.g., the user 101). For example, a publisher, author, or other copyright owner may require, by contract or otherwise, that the content on the front side 201 take some specific form. For example, the content on the front side 201 may replicate the front side of a print version of the book. In some examples, the content of the spine 204 is similarly predefined.

The back side 202, which may be referred to as a back cover, may include a plurality of areas 214(1)-214(N).

Generally, the back side 202 may be an area of the physical artifact 200 that is customizable by a user and/or include content that is different from a back cover of a print version of the book.

In some examples, the layout of the content on the back side 202 is defined with respect to a template of a plurality of predefined templates. For example, a designer may design a set of templates that include various combinations of the numbers, the locations, the sizes, the shapes, and/or the content of the areas 214. These templates may be presented to the user as an option for laying out the back side 202. The templates may also correspond to the dimensions of the physical artifact 200.

In some examples, the dimensions of the physical artifact 200 may be selected based on a selected template, from a predefined list, or as inputs from the user 101. Regarding the predefined list, a set of standard dimensions may be made available. Each standard dimension size may be associated with a three-dimensional model that is used as the base model for generating manufacturing instructions for producing the physical artifact 200. In some examples, when a non-standard set of dimensions is requested, a closest-fitting model may be selected and scaled to match the requested dimensions. In some examples, standards dimensions may include one or more of the following standard book sizes (in inches) organized by genre: fiction (e.g., 4.25×6.87, 5×8, 5.25×8, 5.5×8.5, 6×9), novella (5×8), children's (7.5×7.5, 7×10, 10×8), textbooks (6×9, 7×10, 8.5×11), non-fiction (5.5×8.5, 6×9, 7×10), and memoir (5.25×8, 5.5×8.5).

In some examples, the numbers, the locations, the sizes, the shapes, and/or the content of the areas 214 may be customized. For example, while four areas 214 are illustrated, in some examples, fewer than or greater than four areas 214 are included on the back side 202. In some examples, at least some of the areas 214 (e.g., the area 214(1)) may be populated with predefined content. For example, the area 214(1), which is highlighted in FIG. 3, may include content that is not customizable by the user 101 and/or is otherwise required to be included on the back side 202.

Examples of content that may be included in the areas 214 include a description of the book, an identification of the author, an identification of related works, an identification of identifiers (e.g., barcodes, uniform resource locators (URLs), and the like) to related works, quotes from the book (e.g., text selected or otherwise highlighted by the user or by somebody else), comments and/or images from the user (e.g., a personalize message from the user), a signature from the author, a picture of the author, a picture from the book, an identifier to a network location for downloading a sample of the book, description and/or an identifier to a network location for following and/or viewing an author page for the author of the book, description of and/or an identifier to a network location for viewing a series page to which the book belongs, description of and/or an identifier to a network location for viewing a webpage describing the book, description of and/or an identifier to a network location associated with an entry in an online encyclopedia (e.g., Wikipedia) that is associated with the book, a description of and/or an identifier to a network location for purchasing the book (e.g., an electronic marketplace), description of and/or an identifier to a specific portion of a network location for purchasing the book (e.g., a details portion, a comments portion, a rating portion, a purchase portion, etc.), description of and/or an identifier to a network location for purchasing the book in connection with an affiliate code (e.g., a code associated with a profile of the user 101 and which enables payment to the user 101 when others purchase the book, e.g., by others who view the physical artifact 200, link to the network location, and purchase some version of the book), and any other suitable content.

Figure 4:
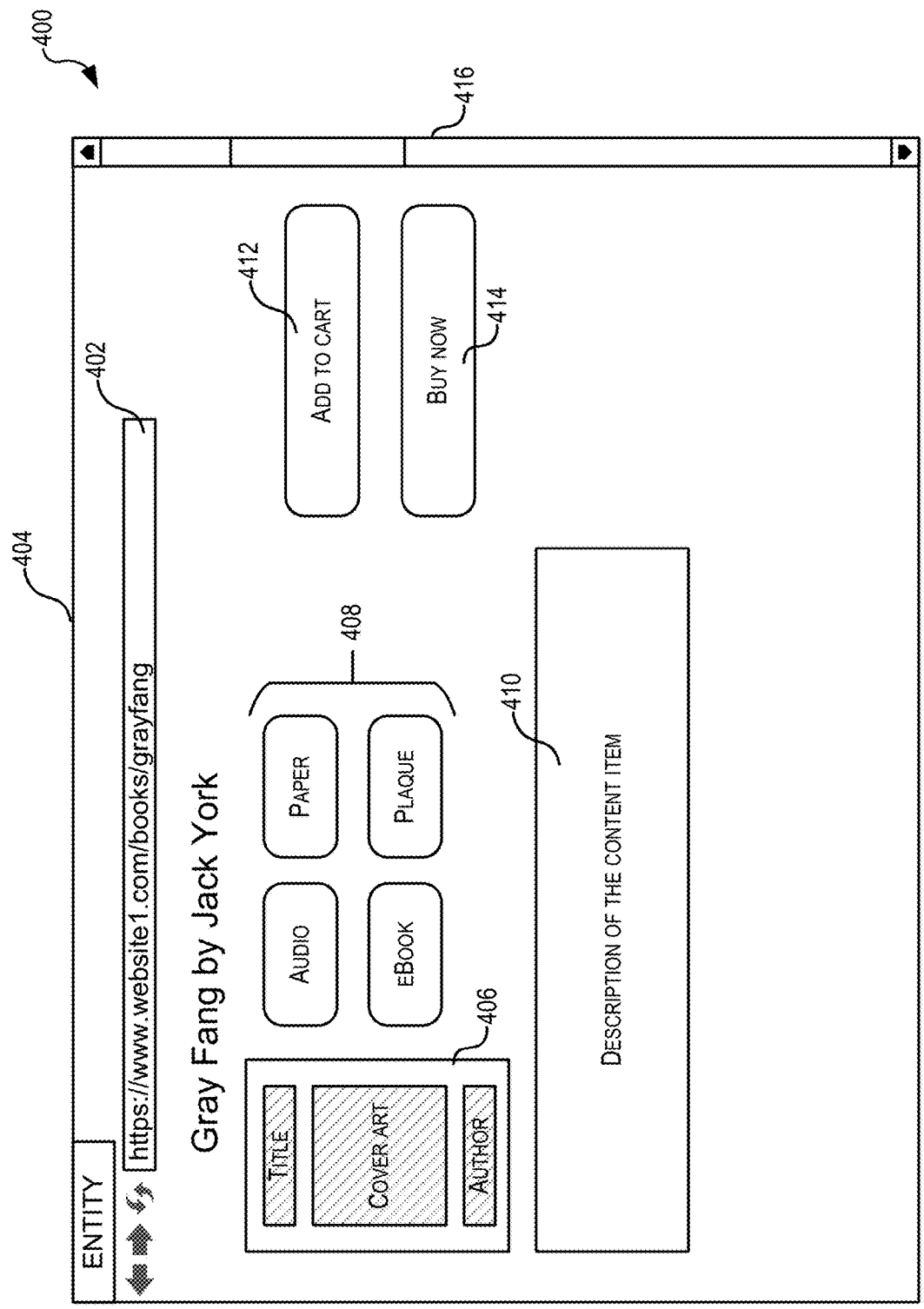
FIG. 4 illustrates an example user interface for interacting with a user device to implement techniques relating to generating instructions for producing physical artifacts corresponding to digital content items, according to at least one example.

FIG. 4 illustrates an example user interface 400 for interacting with a user device (e.g., the user device 104) to implement techniques relating to generating instructions for producing physical artifacts 106 corresponding to digital content items, according to at least one example. The user interface 400 is illustrated as a webpage 402 within a web browser 404. It should be understood that the user interface 400 may also be presented as part of a stand-alone application, a web-based application, a mobile application, or within other operating environments.

Generally, the user interface 400 is used to present information about the book "Gray Fang" by Jack York and receive user requests to purchase various versions of the book. In some examples, the user interface 400 may be considered a "details" page for the book hosted by an electronic marketplace. In this manner, the user interface 400 includes a graphical representation 406 of the book, purchase options 408, a description 410 of the book, an add to cart button 412, and a buy now button 414. These are examples of user interface elements and can include input control elements such as checkboxes, radio buttons, drop-down lists, list boxes, buttons, toggles, text fields, date fields, and other similar input control elements to receive user input. In some examples, the user interface elements can include navigational components (e.g., breadcrumb, slider, search field, pagination, slider, tags, icons).

Figure 5:
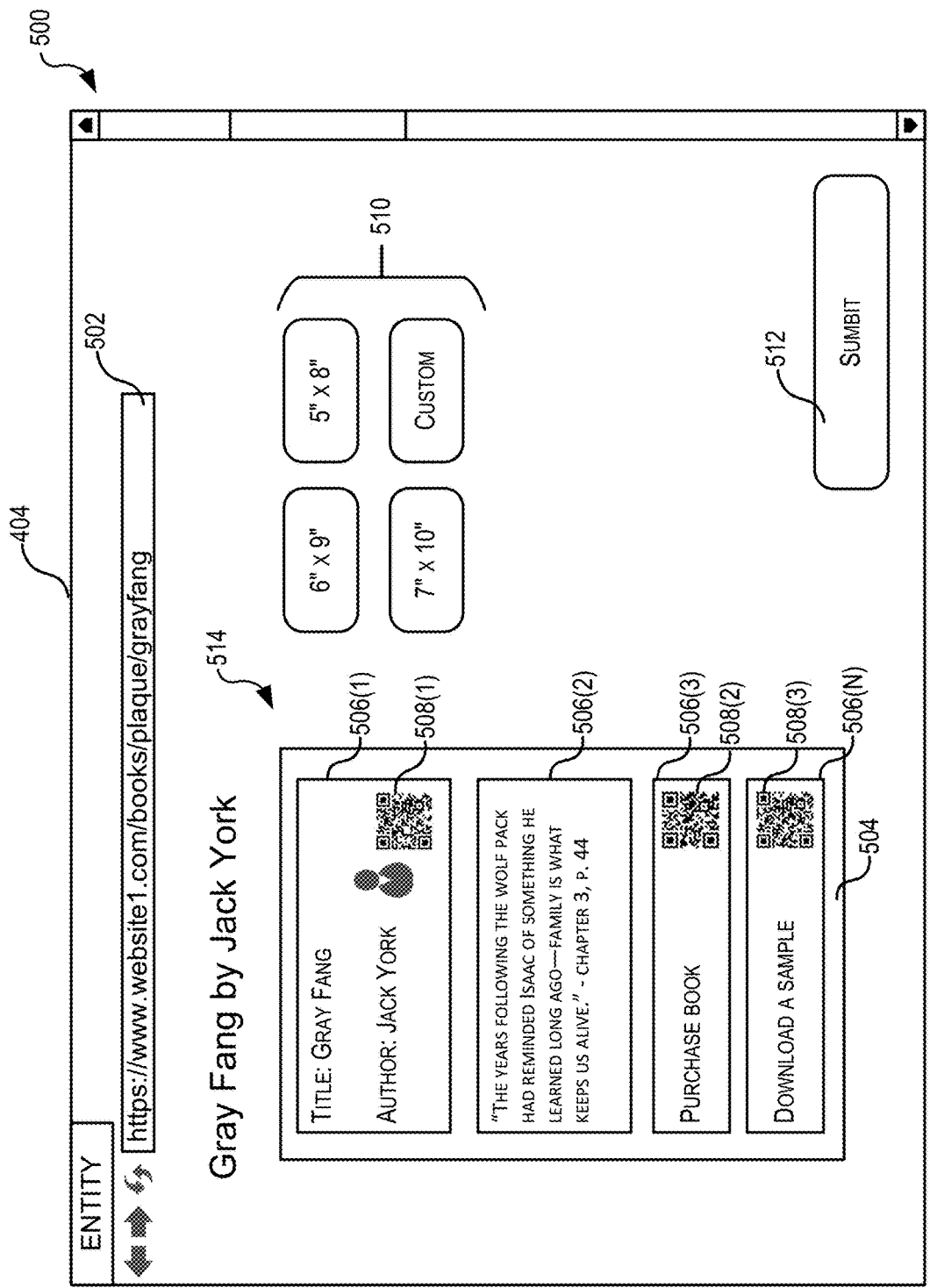
FIG. 5 illustrates an example user interface for interacting with a user device to implement techniques relating to generating instructions for producing physical artifacts corresponding to digital content items, according to at least one example.

The graphical representation 406 of the book may be similar to a front cover of a print version of the book. The purchase options 408 are presented as a set of user interface elements such as buttons, toggles, radio buttons, etc. that are selectable by a user. Selection of the audio purchase option button 408 enables purchase of an audio version of the book. Similarly, selection of the paper and eBook purchase options 408 respectively enable purchase of paper and eBook versions of the book. Selection of the plaque purchase option 408 enables purchase of a physical artifact (e.g., the physical artifacts 106 and 200), described herein. In some examples, selection of the plaque purchase button 408 may initiate a process by which the physical artifact 106 is designed, customized, and approved by the user in order to generate manufacturing instructions for producing the physical artifact. FIG. 5 illustrates an example user interface for use in customizing aspects of the physical artifact.

The description 410 of the book describes aspects of the book. The add to cart button 412 is used to add a selected version of the book, as indicated by selection of a purchase option 408, to a virtual cart. In some examples, a user is presented an option to add a physical artifact within the virtual cart page. For example, after the user has added a different version of the content item to the cart, but before checking out, the user may have another option to add the physical artifact to the order. In some examples, an additional option to purchase the physical artifact may be presented as part of a "Thank You" page (e.g., a page presented after the user has completed the purchase). This page may be presented to give the user an option to review the purchase details and make any changes (e.g., cancel, change delivery address, etc.). As part of this page, the system may provide an option to add a physical plague to the order.

The buy now button 414 enables immediate purchase of the selected version of the book. In some examples, when the physical artifact purchase option 408 is selected, the buy now button enables immediate purchase of a physical artifact having a set of user-defined characteristics. For example, a user may define the characteristics within a user profile. When the manufacturing management system 102 receives a buy now request of a physical artifact, the manufacturing management system 102 may check the user profile for any user-defined characteristics (e.g., defining which sections to include, their locations, barcodes, dimensions, colors, etc.) and, if it finds them, produce the physical artifact in accordance with the user-defined characteristics. If no user-defined characteristics are found in the user profile or otherwise, the manufacturing management system 102 may produce the physical artifact using a standard template.

The user interface 400 also includes a scroll bar 416. The scroll bar 416 enables scrolling of the webpage 402 to view additional content. For example, scrolling in the webpage 402 may reveal additional details about the book, reviews, suggested books based on this book, a rating, and the like.

FIG. 5 illustrates an example user interface 500 for interacting with a user device (e.g., the user device 104) to implement techniques relating to generating instructions for producing physical artifacts 106 corresponding to digital content items, according to at least one example. The user interface 500 is illustrated as a webpage 502 within a web browser 501, which is an example of the web browser 504. It should be understood that the user interface 500 may also be presented as part of a stand-alone application, a web-based application, a mobile application, or within other operating environments.

The user interface 500 may be presented responsive to selection of the plaque purchase option 408. Thus, generally, the user interface 500 is used to present information about customization options for a physical artifact 514 relating to the book "Gray Fang" by Jack York and receive user input relating to the customization options. The physical artifact 514 is an example of the physical artifacts 106 and 200 described herein in FIGS. 1, 2, and 3.

The user interface 500 includes a graphical representation of the back cover 504 of the physical artifact 514. The graphical representation of the back cover 504 represents how the physical artifact 514 will look after being manufactured. The graphical representation of the back cover 504 includes a plurality of areas 506(1)-506(N). The areas 506 are examples of the areas 214.

The area 506(1) includes bibliographic information about the book such as the title, author, an image of the author, and a machine-readable code 508(1). Scanning the machine-readable code 508(1) may enable the user to learn more about the author, view other works by the author, and/or follow the author on a social media platform. The area 506(1) may also include other information such as a description of the book.

The area 506(2) includes a quote from the book. The quote may have been selected by the user who is ordering the physical artifact 514. For example, the user may input the quote into the area 506(2). In some examples, the manufacturing management system 102 may access a repository associated with an electronic profile of the user to populate the area 506(2). For example, as the user reads an eBook version of the book, the user may flag certain passages which are then saved in the repository. If the user desires to include a passage from the book in the area **506(*s*), the manufacturing management system 102** may check whether the repository includes any passages and, if so, present the user with an option to select one.

In some examples, the area 506(2) may include a personalized note that does not come from the book. For example, the user may make a note about who gifted the book to her, why the book is important to her, and any other personalized note. If the physical artifact 514 is being given as a gift to a second user, the first user may add a personalized note such as "I know how much this book means to you, here is a something to remind you of it!". In some examples, the area 506(2) may include a message from the author. For example, the author may sign the physical artifact 514 and include a message to the purchaser. In some examples, the message from the author may be personalized or may be generic. The author may agree to sign and write messages during certain times of the year. If the author is available to sign and write a message, the manufacturing management system 102 may prompt the user in the user interface 500 that such an option is available.

The area 506(3) includes a machine-readable code 508(2). When the code 508(2) is scanned by a user device, the user device may be presented with an option to purchase the book. This may include presenting a detail page associated with the book, e.g., the user interface 400. At the detail page, the user may learn more about the book and decide whether to purchase whichever version might be available. In some examples, the code 508(2) may link to a specific part of the detail page (e.g., a purchase area, a description area, a review area, a rating area, etc.). In some examples, the manufacturing management system 102 may enable the user to decide to which area of the detail page to navigate. In other examples, the manufacturing management system 102 may determine to which area of the detail page to navigate.

The area 506(N) includes a machine-readable code 508(3). When the code 508(3) is scanned by a user device, the user device is presented with an option to download a sample of the book. In some examples, this may include presenting a detail page associated with the book, e.g., the user interface 400. In some examples, this may include presenting a browser-based reader for reading the sample. Depending on the user device used to scan the code 508(3), the sample may be opened in an application of the user device such as an eBook reader application. In some examples, the user device may be an eBook reader device, and the sample may be downloaded to a digital library of the eBook reader and openable in the eBook reader's application.

The user interface 500 also includes a set of dimension options 510 and a submit button 512. The set of dimensions 510 include a few options for sizing the physical artifact 514. In some examples, at least some of the set of dimension options 510 may be standard sizes. In some examples, the set of dimension options 510 may include a custom option. Selection of the custom option may enable the user to input a custom set of dimensions, which will enable production of a customized-sized physical artifact 514.

In some examples, after selecting one of the dimension options 510 and/or immediately after the user has customized the content, a preview of the physical artifact 514 may be provided at the user device (e.g., as a new page and/or as a popup to overlay the current page). The preview may include multiple views of a two-dimensional rendering and/or a three-dimensional rendering of what the physical artifact 514 will look like given the customization options. In some examples, the user may interact with the three-dimensional rendering (e.g., zoom in/zoom out, rotate, etc.) to view different sides of the rendering. If the user desires to adjust features of the physical artifact, the user may return to the user interface 500 to do so. If the user approves of the rendering, the user may select the submit button 512, which may be presented in the preview or in the user interface 500.

In any event, selection of the submit button 512 may finalize the customization portion of the purchase of the physical artifact 514.

Figure 6:
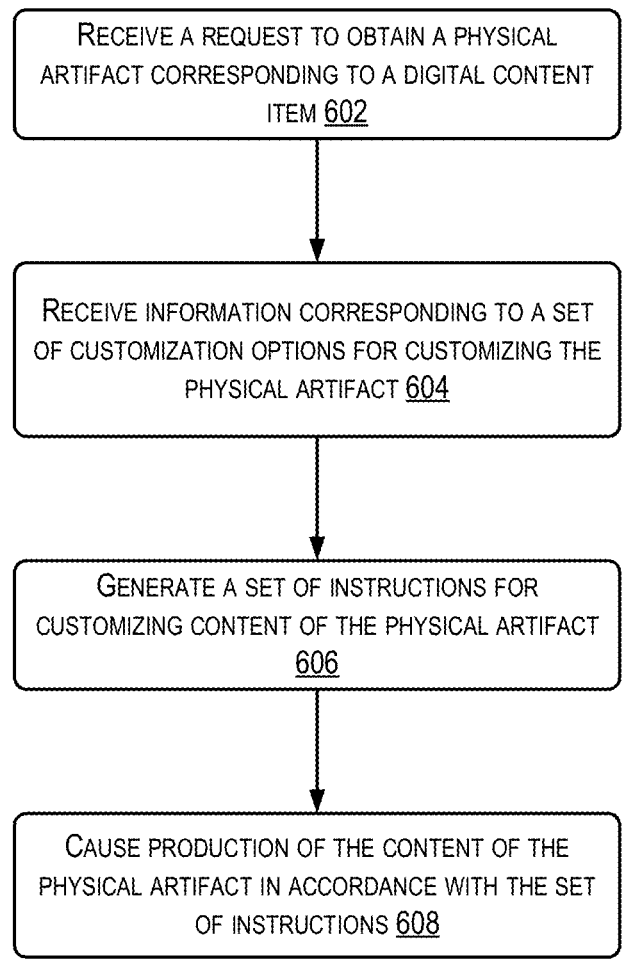
FIG. 6 illustrates an example flow diagram depicting a process for implementing techniques relating to generating instructions for producing physical artifacts corresponding to digital content items, according to at least one example.

FIG. 6 illustrates example a flow diagram showing a process 600, as described herein. The process 600 is illustrated as a logical flow diagram, each operation of which represents a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be omitted or combined in any order and/or in parallel to implement the processes.

Additionally, some, any, or all of the processes may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable storage medium, for example, in the form of a computer program comprising a plurality of instructions executable by one or more processors. The computer-readable storage medium is non-transitory.

FIG. 6 illustrates an example flow diagram depicting a process for implementing techniques relating to generating instructions for producing physical artifacts corresponding to digital content items, according to at least one example. A manufacturing management engine 706 (FIG. 7) of the manufacturing management system 102 (FIG. 1) may perform the process 600.

The process 600 may begin at block 602 by the manufacturing management system 102 receiving a request to obtain a physical artifact corresponding to a digital content item. The request may be received from a user device such as the user device 104. The physical artifact may include at least a front side and a back side.

At block 604, the process 600 may include the manufacturing management system 102 receiving information corresponding to a set of customization options for customizing content of the physical artifact. This may include customizing content of at least two adjacently-located sides (e.g., a back cover and a spine). The set of customization options may include at least an option for inclusion of a machine-readable identifier that identifies a network location associated with the digital content item, and an option for inclusion of text relating to the digital content item. In some examples, the text may relate to at least one of an author of the digital content item or a description of the digital content item. In some examples, the set of customization options may also include an option for inclusion of a quote from the digital content item, an option for a size of the physical artifact, or an option for inclusion of a personal note relating to the digital content item.

The machine-readable identifier may be a two-dimensional barcode, one-dimensional barcode, and any other suitable object for encoding information.

The network location may resolve to a details page at which the digital content item may be purchased, an author page associated with an author of the digital content item, a series page associated with a series to which the digital content item belongs, and/or a sample page at which a sample of the digital content item may be obtained.

The text relating to the digital content item may include a name of an author of the digital content item, a description of the digital content item, a title of the digital content item, an excerpt from the digital content item, and/or a custom reader message.

In some examples, the machine-readable identifier may identify an affiliate code associated with a custodian of the physical artifact. The affiliate code may be used to attribute a purchase of the book to the custodian (e.g., the user to whom the physical artifact belongs).

In some examples, the set of customization options may include an option that identifies a set of dimension of the physical artifact. In this example, the process 600 may further include selecting a template associated with a three-dimensional model based at least in part on the set of dimensions.

In some examples, the process 600 may further include providing a user interface for presentation at the user device. The user interface may include a user interface element which represents an option for obtaining the physical artifact corresponding to the digital content item.

In this example, receiving the request may include receiving, via the user interface, a user selection of the user interface element. In some examples, the process 600 may further include receiving, via the user interface, the information corresponding to the set of customization options for customizing at least the back side of the physical artifact.

In some examples, providing the user interface may include providing the user interface responsive to an electronic book reader application detecting completion of the digital content item. For example, the application may detect when the user after the user arrives at the "end" of the electronic book, an option may be presented to perform an "end action" such as purchase the physical artifact, submit a review, follow the author, etc. In some examples, providing the user interface may include providing the user interface responsive to a request to view a detail page associated with the digital content item. For example, a user may search for the digital content item in an electronic marketplace, and the user interface may be presented in a webpage associated with the digital content item within the electronic marketplace.

At block 606, the process 600 may include the manufacturing management system 102 generating a set of instructions for customizing the content of the physical artifact. This may include generating based at least in part on the request and the information corresponding to the set of customization options. The set of instructions may indicate required content for one or more sides of the physical artifact. For example, the required content may include cover art for the digital content item that may not be modified. The set of instructions may also indicate layout, colors, sizes, etc. for all other content such as content on the back cover.

In some examples, the process 600 may further include accessing a three-dimensional model corresponding to the physical artifact. In this example, generating the set of instructions may be further based on the model. The three-dimensional model may be a model of the artifact used by a three-dimensional printer. The customization options may be used to customize the dimensions of the physical artifact and what is printed on the side(s) of the physical artifact. In some examples, a single three-dimensional model is used and scaled to match the requested dimensions. In other examples, a set of three-dimensional models are used and, depending on the requested dimensions, one of the set is selected.

At block 608, the process 600 may include the manufacturing management system 102 causing production of the content of the physical artifact in accordance with the set of instructions. This may include enabling a printing machine to use the set of instructions to produce the content of the physical artifact. In some examples, the set of instructions are also for producing the physical artifact itself. The set of instructions may be machine-readable and/or user-readable. In some examples, the printing machine may be a three-dimensional printer. In this example, enabling the printing machine to use the set of machine-readable instructions to produce the physical artifact may include providing the instructions to the three-dimensional printer, and instructing the three-dimensional printer to produce the physical artifact in accordance with the set of machine-readable instructions.

In some examples, the physical artifact may be a three-dimensional rectangular-shaped plaque and the digital content item may be an electronic book, a movie, a song, or an album. Thus, the physical artifact may correspond to any suitable digital content item.

In some examples, the process 600 may further include, after producing the physical artifact, enabling delivery of the physical artifact to an address associated with a user profile of the user who ordered the physical artifact.

Figure 7:
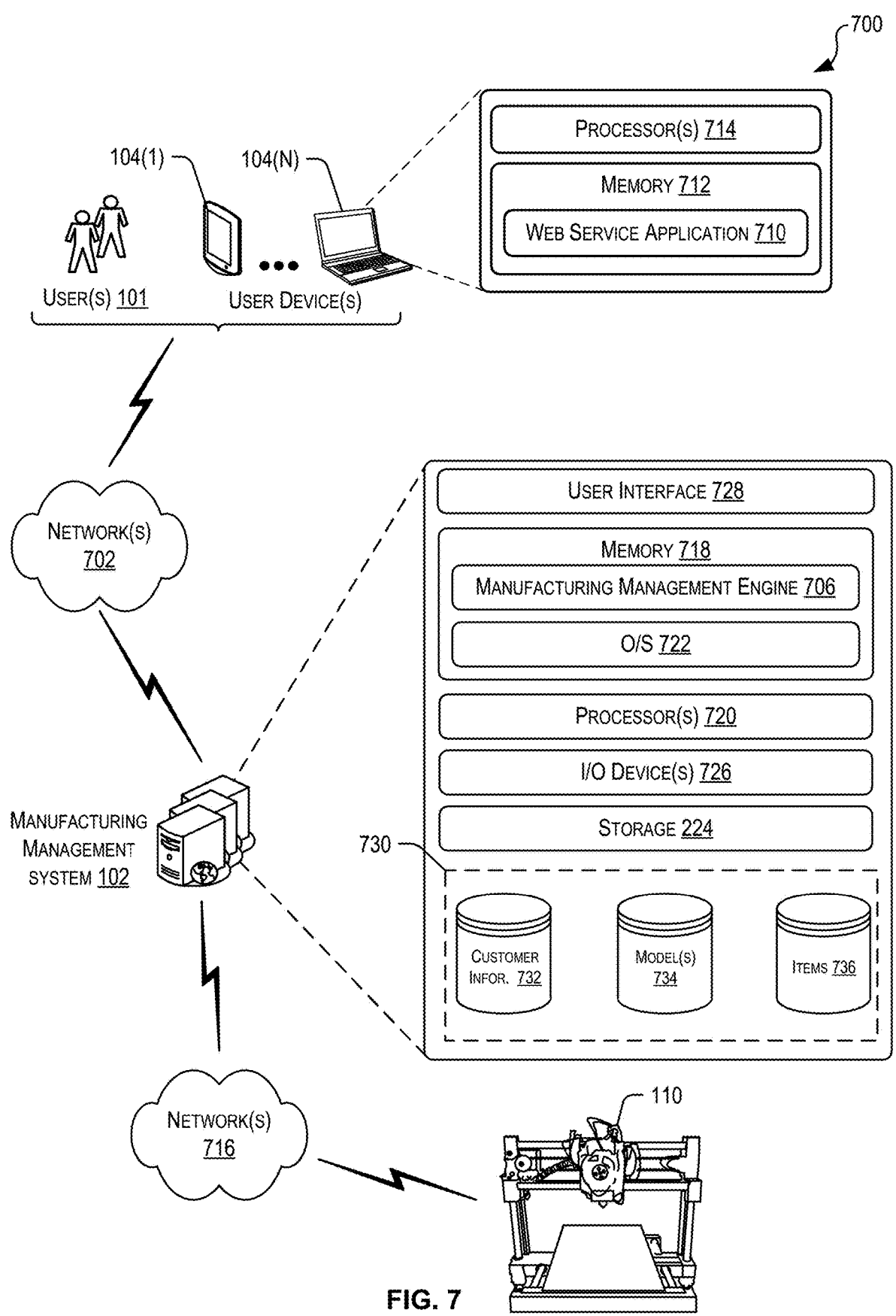
FIG. 7 illustrates an example schematic architecture for implementing techniques relating to generating instructions for producing physical artifacts corresponding to digital content items, according to at least one example.

FIG. 7 illustrates an example schematic architecture or system 700 for implementing techniques relating to generating instructions for producing physical artifacts corresponding to digital content items, according to at least one example. The architecture 700 may include the manufacturing management system 102 in communication with one or more user devices 104(1)-104(N) (hereinafter, "the user device 104") via one or more networks 702 (hereinafter, "the network 702"). The user device 104 may be operable by one or more users 101 (hereinafter, "the user 101") to interact with the manufacturing management system 102. The network 702 may include any one or a combination of many different types of networks, such as cable networks, the Internet, wireless networks, cellular networks, and other private and/or public networks. The user 101 may be any suitable user including, for example, customers of an electronic marketplace that are associated with the manufacturing management system 102, or any other suitable user.

The architecture 700 may also include the production apparatus 110 in communication with at least the manufacturing management system 102 via a secondary network 716. The secondary network 716 may include any one or a combination of many different types of networks, such as cable networks, the Internet, wireless networks, cellular networks, and other private and/or public networks. In some examples, the secondary network 716 may also include hard-wired connection between the manufacturing management system 102 and the production apparatus 110. In any event, instructions may be sent from the manufacturing management system 102 via the secondary network 716 to the production apparatus 110. In some examples, the production apparatus 110 sends information in the form of feedback to the manufacturing management system 102 via the secondary network 716 or otherwise (e.g., by writing to a disk and transferring). In some examples, the production apparatus 110 also communicates via the network 702.

Turning now to the details of the user device 104, the user device 104 may be any suitable type of computing device such as, but not limited to, a digital camera, a wearable device, a tablet, a mobile phone, a smart phone, a personal digital assistant (PDA), a laptop computer, a desktop computer, a thin-client device, a tablet computer, a set-top box, or any other suitable device capable of communicating with the manufacturing management system 102 via the network 202 or any other suitable network. For example, the user device 104(1) is illustrated as an example of a smart phone, while the user device 104(N) is illustrated as an example of a laptop computer.

The user device 104 may include a web service application 710 within memory 712. Within the memory 712 of the user device 104 may be stored program instructions that are loadable and executable on processor(s) 714, as well as data generated during the execution of these programs. Depending on the configuration and type of user device 104, the memory 712 may be volatile (such as random access memory (RAM)) and/or non-volatile (such as read-only memory (ROM), flash memory, etc.). The web service application 710, stored in the memory 712, may allow the user 101 to interact with the manufacturing management system 102 via the network 202. Such interactions may include, for example, interacting with user interfaces provided by the manufacturing management system 102, selecting physical artifacts, customizing physical artifacts, and placing orders for physical artifacts, performing any other interaction described herein or relating to obtaining physical artifacts, and any other suitable client-server interactions. The manufacturing management system 102, whether associated with the electronic marketplace or not, may host the web service application 710.

Turning now to the details of the manufacturing management system 102, the manufacturing management system 102 may include one or more service provider computers, perhaps arranged in a cluster of servers or as a server farm, and may host web service applications. These servers may be configured to host a website (or combination of websites) viewable on the user device 104 (e.g., via the web service application 710). The user 101 may access the website to view items (e.g., physical artifacts) that can be ordered from the manufacturing management system 102 (or an electronic marketplace associated with the manufacturing management system 102). These may be presentable to the user 101 via the web service applications.

The manufacturing management system 102 may include at least one memory 718 and one or more processing units (or processor(s)) 720. The processor 720 may be implemented as appropriate in hardware, computer-executable instructions, software, firmware, or combinations thereof. Computer-executable instruction, software, or firmware implementations of the processor 720 may include computer-executable or machine-executable instructions written in any suitable programming language to perform the various functions described. The memory 718 may include more than one memory and may be distributed throughout the manufacturing management system 102. The memory 718 may store program instructions that are loadable and executable on the processor(s) 720, as well as data generated during the execution of these programs. Depending on the configuration and type of memory including the manufacturing management system 102, the memory 718 may be volatile (such as random access memory (RAM)) and/or non-volatile (such as read-only memory (ROM), flash memory, or other memory). The memory 718 may include an operating system 722 and one or more application programs, modules, or services for implementing the techniques described herein including at least a manufacturing management engine 706. In some examples, the production apparatus 110 is configured to perform the techniques described herein with reference to the manufacturing management system 102, including the manufacturing management engine 706. For example, the production apparatus 110 may include a comparable engine to the manufacturing management engine 706. In some examples, the user device 104 may be configured to perform the techniques described herein with reference to the manufacturing management system 102, including the manufacturing management engine 706. For example, the user device 104 may include a comparable engine to the manufacturing management engine 706. In this example, the user 101 may use the user device 104 to generate the manufacturing instructions 112. The manufacturing instructions 112 may then be provided to the production apparatus 110 in order to produce the physical artifact 106. For example, the manufacturing instructions 112 may be saved to a disk and transferred via the disk to the production apparatus 110 or provided via a local or wide area network, or other connection.

The manufacturing management system 102 may also include additional storage 724, which may be removable storage and/or non-removable storage including, but not limited to, magnetic storage, optical disks, and/or tape storage. The disk drives and their associated computer-readable media may provide non-volatile storage of computer-readable instructions, data structures, program modules, and other data for the computing devices. The additional storage 724, both removable and non-removable, are examples of computer-readable storage media. For example, computer-readable storage media may include volatile or non-volatile, removable or non-removable media implemented in any suitable method or technology for storage of information such as computer-readable instructions, data structures, program modules, or other data. As used herein, modules, engines, and components, may refer to programming modules executed by computing systems (e.g., processors) that are part of the manufacturing management system 102, the user device 104, and/or the production apparatus 110.

The manufacturing management system 102 may also include input/output (I/O) device(s) and/or ports 726, such as for enabling connection with a keyboard, a mouse, a pen, a voice input device, a touch input device, a display, speakers, a printer, or other I/O device.

The manufacturing management system 102 may also include a user interface 728. The user interface 728 may be utilized by an operator or one of the users 101 to access portions of the manufacturing management system 102. In some examples, the user interface 728 may include a graphical user interface, web-based applications, programmatic interfaces such as application programming interfaces (APIs), or other user interface configurations. The manufacturing management system 102 may also include a data store 730. In some examples, the data store 730 may include one or more data stores, databases, data structures, or the like for storing and/or retaining information associated with the manufacturing management system 102. Thus, the data store 730 may include databases, such as a customer information database 732, a model database 734, and a content item database 736.

The customer information database 732 may be used to retain information pertaining to customers of the manufacturing management system 102, such as the user 101. Such information may include, for example, customer account information (e.g., electronic profiles for individual users), demographic information for customers, payment instrument information for customers (e.g., credit card, debit cards, bank account information, and other similar payment processing instruments), account preferences for customers, shipping preferences for customers, purchase history of customers, and other similar information pertaining to a particular customer and sets of customers, of the manufacturing management system 102. In some examples, the information retained in the customer information database 732 may be shared with and/or received from the electronic marketplace.

The model database 734 may be used to retain three-dimensional models corresponding to physical artifacts. The model database 734 may be referenced when the manufacturing management engine 706 attempts to identify a particular three-dimensional item, or generate manufacturing instructions. The model database 734 may be configured to store any suitable data in any suitable formal (e.g., computer-aided drafting (CAD) file such as a STereoLithography file or .STL format) capable of storing a representation of a three-dimensional item.

The digital content item database 736 may be used to retain information about digital content items for which physical artifacts are available. For example, the digital content item database 736 may include a table that includes all digital content items available for purchase in the electronic marketplace, information about the design of the cover, and information that identifies whether a physical artifact may also be obtained for the digital content item.

Figure 8:
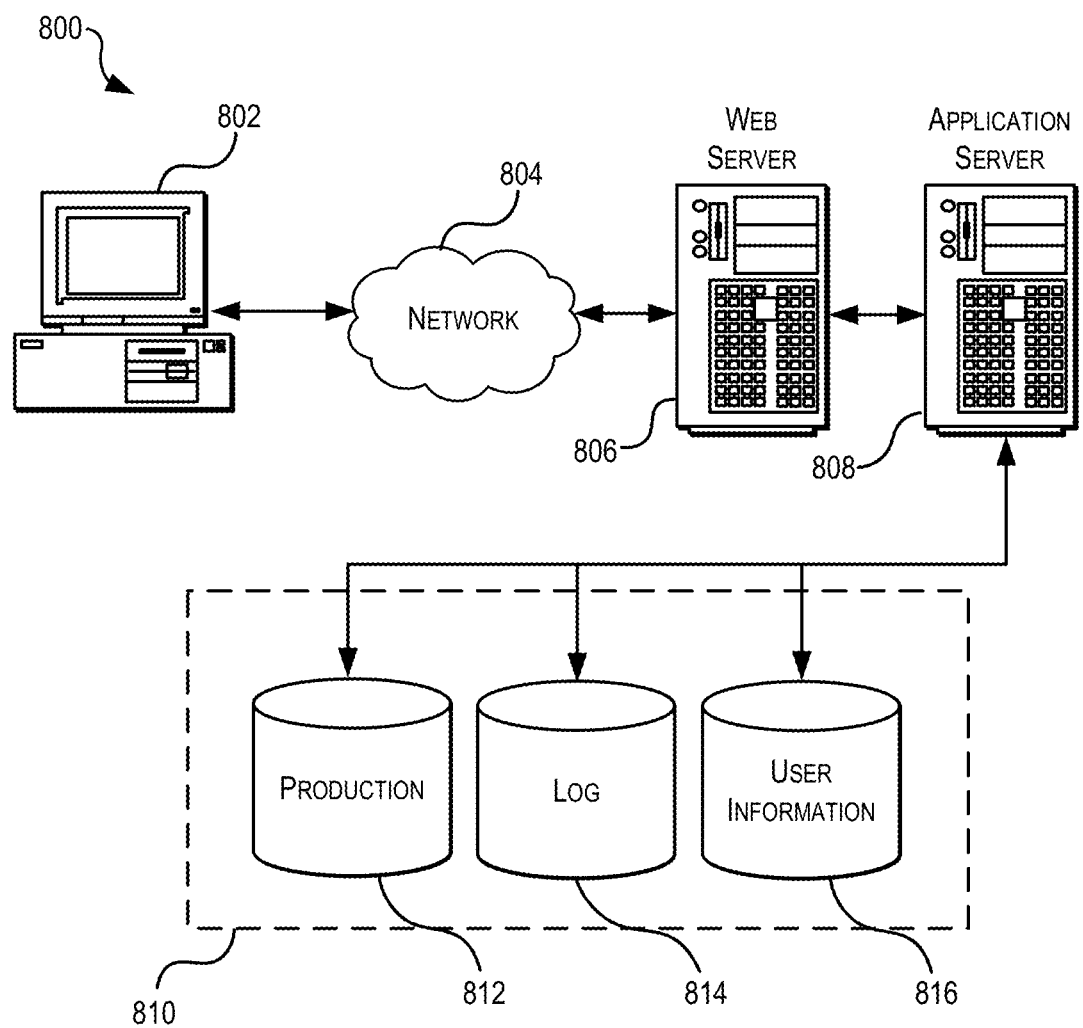
FIG. 8 illustrates an environment in which various techniques relating to generating instructions for producing physical artifacts corresponding to digital content items may be implemented, according to at least one example.

FIG. 8 illustrates an environment in which various techniques relating to generating instructions for producing physical artifacts corresponding to digital content items may be implemented, according to at least one example.

FIG. 8 illustrates aspects of an example system 800 for implementing aspects in accordance with various examples. As will be appreciated, although a Web-based environment is used for purposes of explanation, different environments may be used, as appropriate, to implement various examples. The environment includes an electronic client device 802, which can include any appropriate device operable to send and receive requests, messages, or information over an appropriate network 804 and convey information back to a user of the device. Examples of such client devices include personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the client device 802 and the application server 808, can be handled by the Web server. It should be understood that the Web and application servers are not required and are merely example components, as structured code discussed herein can be executed on any appropriate device or host machine as discussed elsewhere herein.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log data 814, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the client device 802. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one example is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 8. Thus, the depiction of the system 800 in FIG. 8 should be taken as being illustrative in nature and not limiting to the scope of the disclosure.

The various examples further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most examples utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In examples utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of examples, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate examples may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various examples.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Preferred examples of this disclosure are described herein, including the best mode known to the inventors for carrying out the disclosure. Variations of those preferred examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. One or more non-transitory computer-readable media comprising computer-executable instructions that, when executed by one or more computer systems, cause the one or more computer systems to perform operations comprising:
   detecting a user completion of a digital content item;
   providing an option for obtaining a physical artifact corresponding to the digital content item based at least in part on detecting the user completion;
   receiving, via a user selection of the option, a request to obtain the physical artifact corresponding to the digital content item, the physical artifact comprising a first side, a second side, and a third side adjacently located between the first side and the second side;
   receiving information corresponding to a set of customization options for customizing content of at least two adjacently-located sides of at least two of the first side, the second side, and the third side, the set of customization options comprising options (i) for inclusion of a machine-readable identifier that identifies a network location associated with the digital content item, and (ii) for inclusion of text relating to the digital content item;

generating, based at least in part on the request and the information corresponding to the set of customization options, a set of instructions for producing the content of the physical artifact; and causing production of the content of the physical artifact in accordance with the set of instructions.

2. The one or more non-transitory computer-readable media of claim 1, wherein the physical artifact is a three-dimensional rectangular-shaped plaque and the digital content item comprises at least one of an electronic book, a movie, a song, or an album.

3. The one or more non-transitory computer-readable media of claim 1, wherein the network location comprises at least one of:
a details page at which the digital content item may be purchased;
an author page associated with an author of the digital content item;
a series page associated with a series to which the digital content item belongs; or
a sample page at which a sample of the digital content item may be obtained.

4. The one or more non-transitory computer-readable media of claim 1, wherein the text relating to the digital content item comprises at least one of:
a name of an author of the digital content item;
a description of the digital content item;
a title of the digital content item;
an excerpt from the digital content item; or
a custom reader message.

5. The one or more non-transitory computer-readable media of claim 1, wherein the machine-readable identifier is associated with an affiliate code associated with a custodian of the physical artifact.

6. The one or more non-transitory computer-readable media of claim 1, wherein providing the option comprises providing a user interface for presentation at a user device, the user interface comprising a user interface element which represents the option for obtaining the physical artifact.

7. The one or more non-transitory computer-readable media of claim 6, wherein detecting the user completion of the digital content item comprises detecting the user completion based at least in part on and responsive to receiving information from an electronic book reader application that the digital content item has been completed.

8. The one or more non-transitory computer-readable media of claim 6, wherein providing the user interface comprises providing the user interface responsive to receiving a request to view a detail page associated with the digital content item.

9. The one or more non-transitory computer-readable media of claim 1, wherein the operations further comprises receiving, from an external source, a second set of instructions that indicate required content for at least one side of the first side, the second side, or the third side.

10. A computer-implemented method performed under the control of one or more processors, the method comprising:
detecting a user completion of a digital content item;
providing an option for obtaining a physical artifact corresponding to the digital content item based at least in part on detecting the user completion;
receiving, via a user selection of the option, a request to obtain the physical artifact corresponding to the digital content item, the physical artifact comprising a first side, a second side, and a third side adjacently located between the first side and the second side;
receiving information corresponding to a set of customization options for customizing content of at least two adjacently-located sides of at least two of the first side, the second side, and the third side, the set of customization options comprising options (i) for inclusion of a machine-readable identifier that identifies a network location associated with the digital content item, and (ii) for inclusion of text relating to the digital content item;
generating, based at least in part on the request and the information corresponding to the set of customization options, a set of instructions for producing the content of the physical artifact; and
causing production of the content of the physical artifact in accordance with the set of instructions.

11. The computer-implemented method of claim 10, wherein the physical artifact is a three-dimensional rectangular-shaped plaque and the digital content item comprises at least one of an electronic book, a movie, a song, or an album.

12. The computer-implemented method of claim 10, wherein the network location comprises at least one of:
a details page at which the digital content item may be purchased;
an author page associated with an author of the digital content item;
a series page associated with a series to which the digital content item belongs; or
a sample page at which a sample of the digital content item may be obtained.

13. The computer-implemented method of claim 10, wherein the text relating to the digital content item comprises at least one of:
a name of an author of the digital content item;
a description of the digital content item;
a title of the digital content item;
an excerpt from the digital content item; or
a custom reader message.

14. The computer-implemented method of claim 10, wherein the machine-readable identifier is associated with an affiliate code associated with a custodian of the physical artifact.

15. The computer-implemented method of claim 10, wherein providing the option comprises providing a user interface for presentation at a user device, the user interface comprising a user interface element which represents the option for obtaining the physical artifact.

16. A system, comprising:
one or more memories configured to store computer-executable instructions;
one or more processors configured to access the one or more memories and execute the computer-executable instructions to at least:
detect a user completion of a digital content item;
provide an option for obtaining a physical artifact corresponding to the digital content item based at least in part on detecting the user completion;
receive, via a user selection of the option, a request to obtain the physical artifact corresponding to the digital content item, the physical artifact comprising a first side, a second side, and a third side adjacently located between the first side and the second side;

receive information corresponding to a set of customization options for customizing content of at least two adjacently-located sides of at least two of the first side, the second side, and the third side, the set of customization options comprising options (i) for inclusion of a machine-readable identifier that identifies a network location associated with the digital content item, and (ii) for inclusion of text relating to the digital content item;

generate, based at least in part on the request and the information corresponding to the set of customization options, a set of instructions for producing the content of the physical artifact; and cause production of the content of the physical artifact in accordance with the set of instructions.

17. The system of claim 16, wherein detecting the user completion of the digital content item comprises detecting the user completion based at least in part on and responsive to receiving information from an electronic book reader application that the digital content item has been completed.

18. The system of claim 17, wherein providing the option comprises providing a user interface responsive to receiving a request to view a detail page associated with the digital content item.

19. The system of claim 16, wherein the physical artifact is a three-dimensional rectangular-shaped plaque and the digital content item comprises at least one of an electronic book, a movie, a song, or an album.

20. The system of claim 16, wherein the network location comprises at least one of:

a details page at which the digital content item may be purchased;

an author page associated with an author of the digital content item;

a series page associated with a series to which the digital content item belongs; or a sample page at which a sample of the digital content item may be obtained.

\* \* \* \* \*